United States Patent
Lee et al.

(10) Patent No.: US 11,713,248 B2
(45) Date of Patent: Aug. 1, 2023

(54) METHOD OF GROWING GRAPHENE SELECTIVELY

(71) Applicant: Samsung Electronics Co., Ltd., Suwon-si (KR)

(72) Inventors: Changseok Lee, Seoul (KR); Changhyun Kim, Seoul (KR); Kyung-Eun Byun, Seongnam-si (KR); Keunwook Shin, Yongin-si (KR); Hyeonjin Shin, Suwon-si (KR); Eunkyu Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 277 days.

(21) Appl. No.: 17/138,194

(22) Filed: Dec. 30, 2020

(65) Prior Publication Data
US 2021/0206643 A1     Jul. 8, 2021

(30) Foreign Application Priority Data

Jan. 3, 2020  (KR) ......................... 10-2020-0001012

(51) Int. Cl.
| | | |
|---|---|---|
| *C23C 16/26* | (2006.01) | |
| *C01B 32/186* | (2017.01) | |
| *C01B 32/194* | (2017.01) | |
| *C23C 16/513* | (2006.01) | |
| *C23C 16/04* | (2006.01) | |
| *C23C 16/02* | (2006.01) | |

(52) U.S. Cl.
CPC .......... *C01B 32/186* (2017.08); *C01B 32/194* (2017.08); *C23C 16/02* (2013.01); *C23C 16/04* (2013.01); *C23C 16/26* (2013.01); *C23C 16/513* (2013.01)

(58) Field of Classification Search
CPC ..... C23C 16/02; C23C 16/0263; C23C 16/04; C23C 16/26
See application file for complete search history.

(56) References Cited

U.S. PATENT DOCUMENTS

| | | | |
|---|---|---|---|
| 8,461,028 B2 | 6/2013 | Colombo et al. | |
| 8,610,278 B1 * | 12/2013 | Ott ...................... | H01L 23/5222 |
| | | | 257/781 |
| 9,159,615 B2 | 10/2015 | Saito et al. | |

(Continued)

FOREIGN PATENT DOCUMENTS

| | | | | |
|---|---|---|---|---|
| KR | 10-2012-0009323 | * | 2/2012 | ........... H01L 21/205 |
| KR | 10-2018-0107557 | * | 10/2018 | ........... C01B 32/182 |

(Continued)

OTHER PUBLICATIONS

Oh, Sooyeoun, et al., "Selective deposition of graphene sheets on a flexible substrate". J. Vac. Sci. Technol. B 32(2), Mar./Apr. 2014, 020602-1 to 020602-5.*

(Continued)

*Primary Examiner* — Bret P Chen
(74) *Attorney, Agent, or Firm* — Harness, Dickey & Pierce, P.L.C.

(57) ABSTRACT

A method of selectively growing graphene includes forming an ion implantation region and an ion non-implantation region by implanting ions locally into a substrate; and selectively growing graphene in the ion implantation region or the ion non-implantation region.

23 Claims, 10 Drawing Sheets

(56) References Cited

U.S. PATENT DOCUMENTS

| | | | |
|---|---|---|---|
| 9,688,540 B2 | 6/2017 | Davis | |
| 2012/0328906 A1* | 12/2012 | Kwon | H01M 4/587 |
| | | | 428/688 |
| 2013/0302978 A1* | 11/2013 | Bonilla | H01L 21/76849 |
| | | | 257/E21.584 |
| 2014/0127896 A1* | 5/2014 | Bonilla | H01L 21/76852 |
| | | | 438/627 |
| 2014/0308523 A1* | 10/2014 | Veerasamy | H01B 13/0026 |
| | | | 252/502 |
| 2015/0214303 A1* | 7/2015 | Ruhl | H01L 29/66015 |
| | | | 257/29 |
| 2015/0357189 A1* | 12/2015 | Davis | H01L 29/1606 |
| | | | 257/29 |
| 2015/0376778 A1 | 12/2015 | Davis | |
| 2016/0233100 A1* | 8/2016 | Godet | H01L 29/66803 |
| 2017/0069436 A1* | 3/2017 | Lee | H01G 11/26 |
| 2018/0301335 A1* | 10/2018 | Tapily | H01L 21/02175 |
| 2018/0346338 A1* | 12/2018 | Cho | C23C 16/26 |
| 2018/0350915 A1 | 12/2018 | Shin et al. | |
| 2020/0105524 A1* | 4/2020 | Shin | C01B 32/186 |
| 2022/0375722 A1* | 11/2022 | Varadarajan | H01L 21/02527 |

FOREIGN PATENT DOCUMENTS

| | | | | |
|---|---|---|---|---|
| WO | WO 2021/067118 A1 * | 4/2021 | | C23C 16/26 |
| WO | WO 2021/168134 A1 * | 8/2021 | | H01L 21/768 |

OTHER PUBLICATIONS

Park, Jaehyun, et al., "Selective growth of graphene in layer-by-layer via chemical vapor deposition". Nanoscale, 2016, 8, 14633-14642.*

Kim, Kwanpyo, et al., "Selective metal deposition at graphene line defects by atomic layer deposition". Nature Communications, 5: 4781, Sep. 2, 2014, pp. 1-9.*

Oh, Sooyeoun, et al., "Selective deposition of graphene sheets on a flexible substrate by a nonuniform electric field". Journal of Vacuum Science & Technology B 32, 020602 (2014) pp. 1-5.*

Hong, Kyung Pyo, et al., "Visualization of CVD-grown graphene on Cu film using area-selective ALD for quality management". Applied Surface Science 496 (2019) 143614, pp. 1-7.*

Xu, Shuaishuai, et al., "Chemical vapor deposition of graphene on thin-metal films". Cell Reports Physical Science, 2, 100372, Mar. 24, 2021, pp. 1-38.*

Chen, Yaofeng, "Selective area chemical vapor deposition of graphene". Graduation Disserations and Theses at Illinois, University of Illinois at Urbana-Champaign, 2018, 3 pages. Abstract Only.*

B. Han et al. 'Phosphorus and boron diffusion paths in polycrystalline silicon gate of a trenchtype three-dimensional metal-oxide-semiconductor field effect transistor investigated by atom probe tomography' *Applied Physics Letters*, 107, 2015, pp. 023506-1-023506-4.

* cited by examiner

METHOD OF GROWING GRAPHENE SELECTIVELY

CROSS-REFERENCE TO RELATED APPLICATION

This application claims the benefit of Korean Patent Application No. 10-2020-0001012, filed on Jan. 3, 2020, in the Korean Intellectual Property Office, the disclosure of which is incorporated herein in its entirety by reference.

BACKGROUND

1. Field

The present disclosure relates to methods of selectively growing graphene by using an ion implantation method.

2. Description of Related Art

Graphene is a crystalline material having a hexagonal honeycomb structure in which carbon atoms are two-dimensionally connected, and has a very small thickness at an atomic size level. Graphene may be synthesized by using a chemical vapor deposition (CVD) method, or may be obtained by stripping graphite layer by layer. Graphene generally includes crystals having a size at a micrometer level. On the other hand, nanocrystalline graphene refers to graphene containing crystals having a nano level size.

Compared to silicon (Si), graphene has advantages of high electric mobility, excellent thermal characteristics, chemical stability, wide surface area, etc.

SUMMARY

Provided are methods of selectively growing graphene by using an ion implantation method.

Additional aspects will be set forth in part in the description which follows and, in part, will be apparent from the description, or may be learned by practice of the presented embodiments of the disclosure.

According to an aspect of an embodiment, a method of growing graphene selectively includes forming an ion implantation region and an ion non-implantation region in a substrate by implanting ions locally into the substrate and selectively growing graphene in the ion implantation region or the non-ion implantation region.

In some embodiments, the ions may include at least one of As, P, B, $BCl_2$, In, Sb, Ge, N, H, He, and C.

In some embodiments, the ions may be implanted in a range of $10^{11}$-$10^{17}$ at/$cm^2$.

Energy may be in a range of about 0.1 keV to about 10,000 keV during ion implantation.

In some embodiments, the ions may be configured to promote growth of graphene.

In some embodiments, the ions may be configured to inhibit growth of graphene.

In some embodiments, the method may further include doping a dopant configured to inhibit growth of graphene on the substrate.

In some embodiments, the method may further include doping boron B into the substrate and phosphorus P into the ion implantation region.

In some embodiments, the method may further include forming a diffusion barrier between the ion implantation region and the substrate.

In some embodiments, the diffusion barrier may include TiN, TaN, graphene, or h-BN.

In some embodiments, the substrate may include a semiconductor, a conductor, or an insulator.

In some embodiments, the substrate may include at least one of silicon, polysilicon, silicon oxide, titanium nitride, and a derivative of these materials or a metal.

In some embodiments, the selectively growing graphene is performed using a plasma chemical vapor deposition process.

In some embodiments, the selectively growing graphene is performed at a temperature of 700 degrees or less.

In some embodiments, the selectively growing graphene is performed at a process pressure in a range about 0.01 Torr to about 5 Torr.

In some embodiments, the selectively growing graphene is performed a reaction gas including a mixture of a carbon source gas, an inert gas, and hydrogen gas as a reaction gas.

In some embodiments, the carbon source gas may include at least one of methane gas, ethylene gas, acetylene gas, and vapor of a liquid precursor including carbon.

In some embodiments, the inert gas may include at least one of argon gas, nitrogen gas, helium gas, krypton gas, and xenon gas.

According to an aspect of an embodiment, a method of growing graphene selectively may include forming a first region in a substrate structure by transferring ions into the first region of the substrate structure and not transferring the ions into a second region of the substrate structure adjacent thereto along a surface of the substrate structure; and selectively growing graphene on the surface of the substrate structure in the first region or the second region.

In some embodiments, the ions may comprise at least one of As, P, B, $BCl_2$, In, Sb, Ge, N, H, He, and C.

In some embodiments, the selectively growing graphene on the surface of the substrate structure may be performed to selectively grow the graphene on the first region of the substrate structure.

In some embodiments, the selectively growing graphene on the surface of the substrate structure may be performed to selectively grow the graphene on the second region of the substrate structure.

In some embodiments, the substrate structure may include a diffusion barrier between the first region of the substrate structure and a portion of the substrate structure adjacent thereto.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
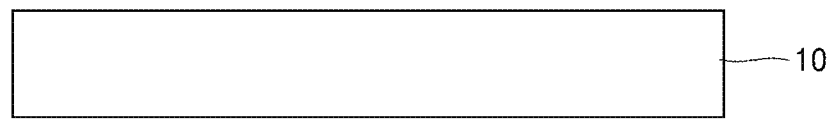
FIGS. 1A to 1C are cross-sectional views for explaining a method of selectively growing graphene, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, methods of selectively growing graphene according to various embodiments will be described in detail with reference to the accompanying drawings. In the drawings, like reference numerals refer to like elements and sizes of elements in the drawings may be exaggerated for convenience of explanation. It will be understood that, although the terms "first", "second", etc. may be used herein to describe various elements, the elements should not be limited by these terms. These terms are only used to distinguish one element from another element.

Singular forms are intended to include the plural forms as well, unless the context clearly indicates otherwise. It should be understood that, when a part "comprises" or "includes" an element in the specification, unless otherwise defined, other elements are not excluded from the part and the part may further include other elements. Also, sizes or thicknesses of elements in the drawings may be exaggerated for convenience of explanation. Also, when it is described that a desired (and/or alternatively predetermined) material layer is present on a substrate or other layer, the material layer may be in direct contact with the substrate or another layer, and another third layer may be present therebetween. In addition, in the embodiments below, materials for forming each layer are examples, and other materials may also be used.

Also, in the specification, the term "units" or " . . . modules" denote units or modules that process at least one function or operation, and may be realized by hardware, software, or a combination of hardware and software.

Specific executions described in the present disclosure are example embodiments and do not limit the technical scope of inventive concepts even in any method. For conciseness of the specification, disclosure of conventional electronic configurations, control systems, software, and other functional aspects of the systems may be omitted. In addition, connections or connection members of lines between components shown in the drawings illustrate functional connections and/or physical or circuit connections, and the connections or connection members may be represented by replaceable or additional various functional connections, physical connections, or circuit connections in an actual apparatus.

The term "above" and similar directional terms may be applied to both singular and plural.

Unless explicitly stated that the operations constituting the method should be in the order described, they may be performed in a suitable order. The use of any and all examples, or example language (e.g., "such as") provided herein, is intended merely to better illuminate inventive concepts and does not pose a limitation on the scope of inventive concepts unless otherwise claimed.

Figure 1B:
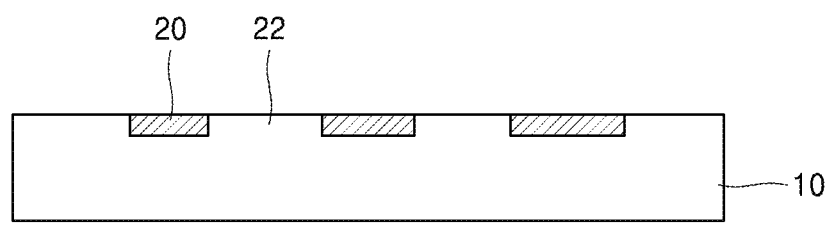
Figure 1C:
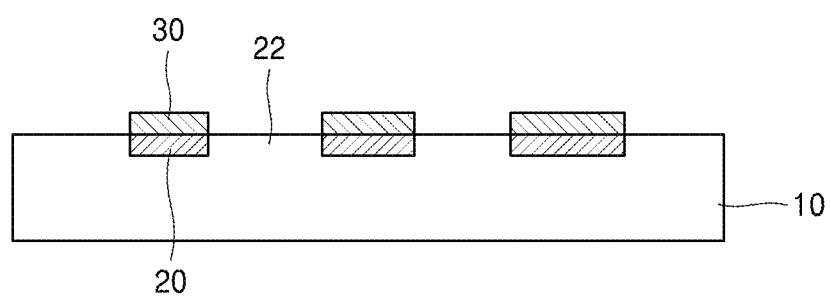

FIGS. 1A to 1C are cross-sectional views for explaining a method of selectively growing graphene, according to an embodiment.

Referring to FIG. 1A, a substrate 10 is provided in a reaction chamber (not shown). The substrate 10 may include a substrate for directly growing graphene. The substrate 10 may include a semiconductor, a conductor, or an insulator. The substrate 10 may include a material that may not perform as a catalyst for graphene growth by being inactivated at a temperature below a desired (and/or alternatively predetermined) temperature (for example, approximately 700 degrees). However, the present embodiment is not limited thereto.

For example, the substrate 10 may include at least one of monocrystalline silicon, amorphous silicon, polysilicon, silicon oxide, titanium nitride, and a derivative of these materials or a metal. The metal may include, for example, copper (Cu), nickel (Ni), ruthenium (Ru), or tungsten (W), but is not limited thereto. The above-mentioned materials are merely examples, and the substrate 10 may include various other materials besides the above materials.

Referring to FIG. 1B, an ion implantation region 20 and an ion non-implantation region 22 may be formed in a surface of the substrate 10 by locally implanting ions into the substrate 10.

Ions may include, for example, at least one of As, P, B, $BCl_2$, In, Sb, Ge, N, H, He, and C. For example, a single type of ions may be implanted as P ions and may be implanted in the ion implantation region 20. Also, P ions and C ions may be implanted together. Ions may be implanted, for example, in a range of $10^{11}$-$10^{17}$ at/cm$^2$. During ion implantation, energy may be in a range of about 0.1 keV to about 10,000 keV. A graphene growth may be selectively performed by controlling a growth mechanism of graphene, such as incubation time or nucleation, by changing a surface state of a substrate or the degree of out diffusion by implanted ions.

Ions may include, for example, ions that promote growth of graphene, which will be described later.

Referring to FIG. 1C, power for generating plasma is applied to a reaction chamber (not shown) from a plasma power source (not shown). Here, the power for plasma generation may be in a range from about 50 W to about 500 W. However, the present embodiment is not limited thereto.

The plasma power supply source may include, for example, a radio frequency (RF) power supply source or a microwave (MW) power supply source.

When power for plasma generation is applied to the reaction chamber from the plasma power source, an electric field may be induced inside the reaction chamber. While an electric field is induced in this way, a reaction gas for growing graphene is injected into the reaction chamber.

When a reaction gas for graphene growth is injected, the growth of graphene 30 may be promoted in the ion implantation region 20, and the graphene growth may be suppressed in the ion non-implantation region 22. Thus, the graphene 30 may be selectively grown in the ion implantation region 20.

As a reaction gas for growing graphene, a mixture gas of a carbon source gas, an inert gas, and hydrogen gas may be used. The carbon source gas may include a gas that supplies carbon for graphene growth. For example, the carbon source gas may include at least one of a hydrocarbon gas and a vapor of a liquid precursor including carbon. The carbon hydrogen gas may include, for example, at least one of methane gas, ethylene gas, and acetylene gas, but is not limited thereto. Also, the liquid precursor may include, for example, at least one of toluene, benzene, anisol, and ethanol.

The inert gas may include, for example, at least one of argon gas, nitrogen gas, helium gas, krypton gas, and xenon gas.

When growing graphene by using plasma, a volume ratio of the carbon source gas, the inert gas, and the hydrogen gas injected into the reaction chamber may be, for example, about 1-15: 10-100:20-100. Here, the volume ratio of the carbon source gas, the inert gas, and the hydrogen gas included in the reaction gas may be appropriately controlled according to growth conditions (for example, growing temperature, etc.).

A process temperature for growing the graphene 30 may be, for example, 700 degrees or less. For example, the process temperature inside the reaction chamber may be about 300 degrees to about 700 degrees.

The process pressure for growing the graphene 30 may be in a range about 0.01 Torr to about 10 Torr. For example, the process pressure range may be in a range from about 0.01 Torr to about 5 Torr. However, this is merely illustrative, and other process pressures may also be used.

In this way, when the reaction gas in which the carbon source gas, the inert gas, and the hydrogen gas are mixed flows into the reaction chamber, the reaction gas is changed into a plasma state by an electric field applied by plasma power.

Active carbon radicals generated by plasma of the reaction gas in which the carbon source gas, the inert gas, and the hydrogen gas are mixed are generated and adsorbed on a surface of the ion implantation region 20 of the substrate 10. The ion implantation region 20 may promote graphene growth. Although graphene may be grown in the ion non-implantation region 22, for example, graphene growth in the ion implantation region 20 may be completed before the graphene growth in the ion non-implantation region 22 starts by controlling the growth time. Plasma of the inert gas in the reaction gas generates activated carbon radicals from the carbon source gas, and the activated carbon radicals generated in this way are adsorbed onto the surface of the ion implantation region 20 of the substrate 10, and as a result, the surface of the substrate 10 is activated. Accordingly, the graphene 30 may be locally grown selectively.

The method of selectively growing graphene of the related art is complicated because the method includes an operation of transferring grown graphene to a substrate and patterning the transferred graphene through a photoresist process, and also, there may be contamination of the graphene from the use of organic materials and solutions. However, in the method according to the present embodiment, a simple and direct growth of graphene may be performed through the ion implantation method on a substrate for graphene growth.

Figure 2A:
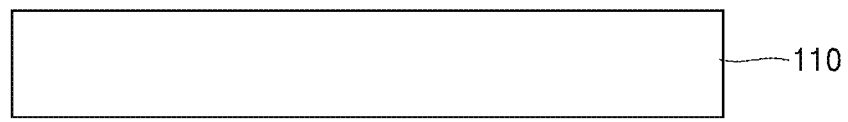
FIGS. 2A to 2C are cross-sectional views for explaining a method of selectively growing graphene, according to another embodiment.
Figure 2B:
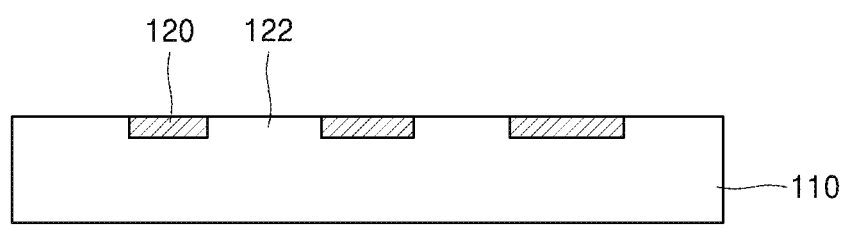
Figure 2C:
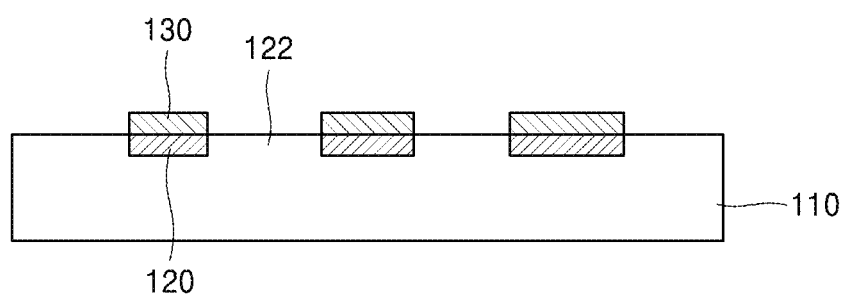

FIGS. 2A to 2C are cross-sectional views for explaining a method of selectively growing graphene, according to another embodiment.

Referring to FIG. 2A, a substrate 110 for growing graphene is provided in a reaction chamber (not shown). The substrate 110 may be doped with a dopant. The dopant may include a material for inhibiting the growth of graphene, which will be described later. For example, the substrate 110 may be entirely doped with boron B. Boron may inhibit the growth of graphene. For example, the substrate 110 may be doped with carbon C. Carbon C may promote the growth of graphene. Regarding the ions that promote the growth of graphene, the smaller the size of the ions, the more the rate and amount of out diffusion, and the larger the size of the ions, the less the rate and amount of out diffusion. If regions where ions having a small size and ions having a large size exist together, it may be controlled that the region where ions having a larger size is first deposited and the region where ions having a small size is not to be deposited by out diffusion.

The substrate 110 may include a semiconductor, a conductor, or an insulator.

For example, the substrate 110 may include at least one of amorphous silicon, polysilicon, silicon oxide, titanium nitride, and a derivative of these materials or a metal. The metal may include, for example, copper (Cu), nickel (Ni), ruthenium (Ru), or tungsten (W), but is not limited thereto. The above-mentioned materials are merely examples, and the substrate 110 may include various other materials besides the above materials.

Referring to FIG. 2B, an ion implantation region 120 and an ion non-implantation region 122 may be formed in a surface of the substrate 110 by locally implanting ions into the substrate 110. Ions may include materials that promote the growth of graphene. Ions may include, for example, at least one of As, P, B, $BCl_2$, In, Sb, Ge, N, H, He, and C. Here, carbon C and P may promote graphene growth, and the remaining ions may inhibit graphene growth. Ions may be implanted, for example, in a range of $10^{11}$-$10^{17}$ at/cm$^2$. During ion implantation, energy may be in a range of about 0.1 keV to about 10,000 keV. In the present embodiment, phosphorus (P) ions may be implanted into the ion implantation region 120, and substrate 110 may be entirely doped with boron (B). This is merely an example, and selectivity may be increased by using ions that promote graphene growth and materials that inhibit graphene growth.

Referring to FIG. 2C, when a reaction gas for growing graphene is injected into the reaction chamber, graphene 130 is grown in the ion implantation region 120 and graphene growth is limited and/or suppressed in the ion non-implantation region 122. The method of growing graphene is substantially the same as that described with reference to FIG. 1C, and thus, a detailed description thereof will be omitted.

Figure 3:
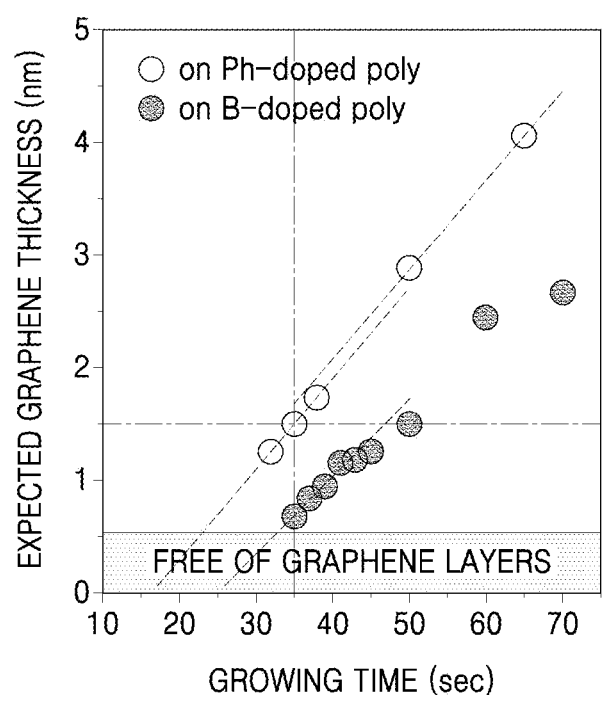
FIG. 3 is a graph showing an expected thickness of graphene versus growth time.

FIG. 3 shows Raman spectra for graphene growth on a P doped polysilicon substrate and a B doped polysilicon substrate. FIG. 3 shows an expected thickness of graphene over growth time. A region below 0.5 on the y-axis may be a region substantially free of graphene layers. The B-doped polysilicon substrate takes a longer time to grow graphene than the P-doped polysilicon substrate. Therefore, when doping the substrate 110 with respect to which graphene is grown of FIG. 2A with boron (B) and implanting phosphorus (P) ions into the ion implantation region 120, the selectivity of graphene growth may be increased by controlling an appropriate growth time.

Figure 4A:
FIGS. 4A to 4C are cross-sectional views for explaining a method of selectively growing graphene, according to another embodiment.
Figure 4B:
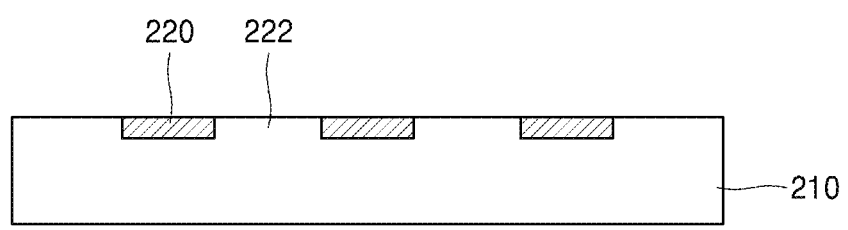
Figure 4C:
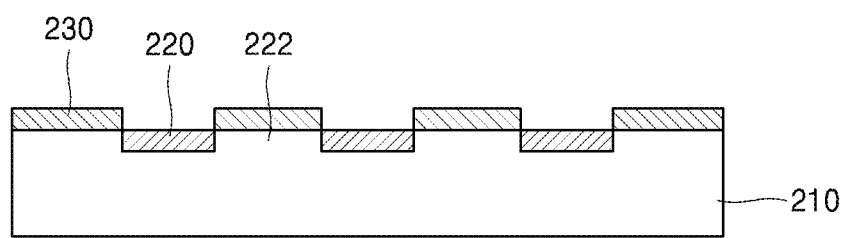

FIGS. 4A to 4C are cross-sectional views for explaining a method of selectively growing graphene, according to another embodiment.

Referring to FIG. 4A, a substrate 210 for growing graphene may be provided. Since the substrate 210 is substantially the same as the substrate 10 described with reference to FIG. 1A, a detailed description thereof will be omitted.

Referring to FIG. 4B, an ion implantation region 220 and an ion non-implantation region 222 may be formed by locally implanting ions into the substrate 210. Ions may include materials that inhibit graphene growth.

Referring to FIG. 4C, when a reaction gas for growing graphene is injected into a reaction chamber (not shown), the growth of graphene 230 is limited and/or suppressed in the ion implantation region 220 and the growth of graphene may be achieved in the non-ion implantation region 222. Therefore, as compared with the method described with reference to FIGS. 1A to 1C, the graphene growth region may be opposite to the region of FIGS. 1A to 1C. Moreover, the preparing of the substrate 210 may further include doping the substrate 210 entirely with a dopant for promoting graphene growth. Dopants that promote graphene growth may include, for example, at least one of As, P, $BCl_2$, In, Sb, Ge, N, H, He, and C. Thus, graphene growth may be promoted in the ion non-implantation region 222.

FIGS. 5A to 5I are cross-sectional views for explaining a method of selectively growing graphene, according to another embodiment.

Figure 5A:
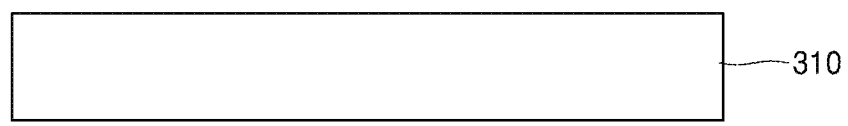
FIGS. 5A to 5I are cross-sectional views for explaining a method of selectively growing graphene, according to another embodiment.
Figure 5B:
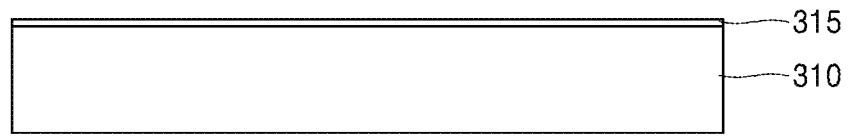
Figure 5C:
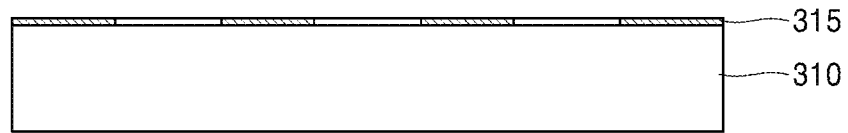
Figure 5D:
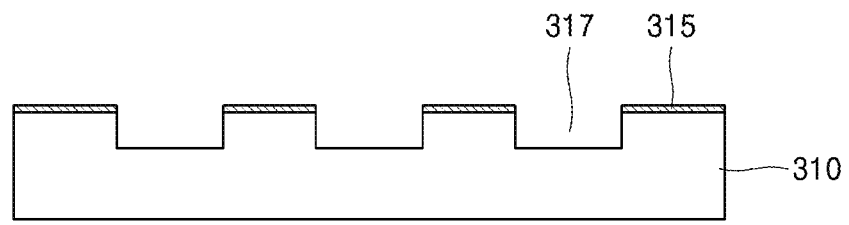

Referring to FIG. 5A, a substrate 310 for growing graphene may be provided. Since the substrate 310 is substantially the same as the substrate 10 described with reference to FIG. 1A, a detailed description thereof will be omitted. Referring to FIG. 5B, photoresist 315 is coated on the substrate 310. Referring to FIG. 5C, the photoresist 315 is patterned through exposure. Referring to FIG. 5D, grooves 317 as regions for ion implantation are formed by etching the substrate 310 and the photoresist 315 according to a pattern illustrated in FIG. 5C, which will be described below.

Figure 5E:
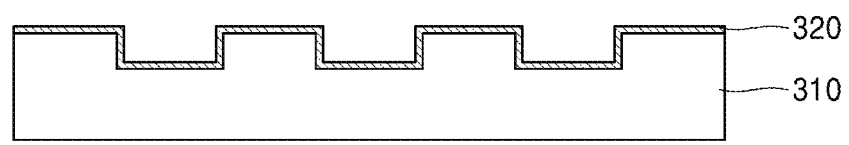

Referring to FIG. 5E, the photoresist is removed and a diffusion barrier 320 is deposited. The diffusion barrier 320 may include, for example, TiN, TaN, graphene, or h-BN. The diffusion barrier 320 may limit and/or prevent a carbon source gas for graphene growth from being diffused into the substrate 310. Thus, the growth of graphene in unwanted regions may be reduced.

Figure 5F:
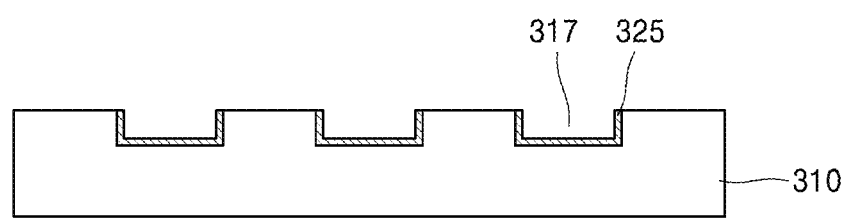

Referring to FIG. 5F, the diffusion barrier 320 in the groove 317 is left and the diffusion barrier 320 in the remaining area is removed.

Figure 5G:
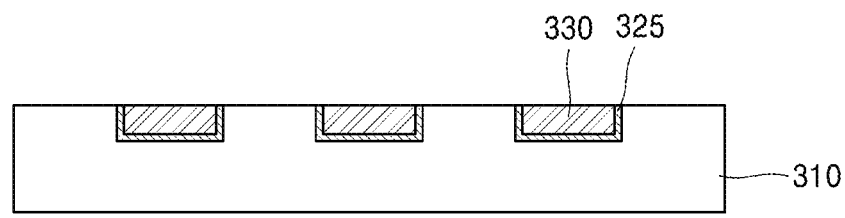

Referring to FIG. 5G, growth units 330 may be formed in the grooves 317, the growth units 330 including a material for growing graphene. The growth units 330 may include at least one of amorphous silicon, polysilicon, silicon oxide, titanium nitride, and a derivative of these materials or a metal. The metal may include, for example, copper (Cu), nickel (Ni), ruthenium (Ru), or tungsten (W), but is not limited thereto. The growth units 330 may include the same material as the substrate 310. However, the present embodiment is not limited thereto, and the growth units 330 may include a material different from that of the substrate 310. The growth units 330 may include, for example, silicon.

Figure 5H:
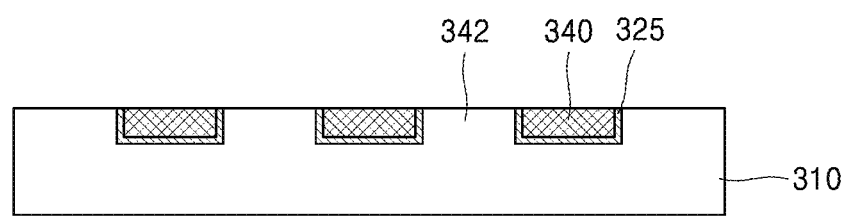

Referring to FIG. 5H, ion implantation regions 340 may be formed by implanting ions into the growth units 330. Regions where the ions are not implanted may be the ion non-implantation regions 342.

Figure 5I:
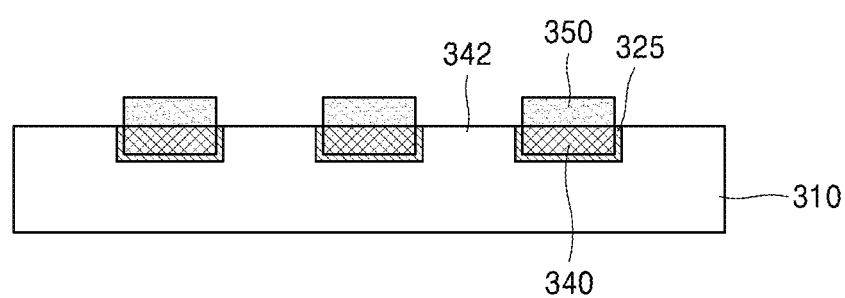

Referring to FIG. 5I, when a reaction gas for graphene growth is injected, graphene 350 may be grown in the ion implantation regions 340 and graphene growth may be suppressed in the ion non-implantation regions 342. As such, graphene 350 may be selectively grown in the ion implantation regions 340. In addition, since diffusion barriers 325 are formed between the ion implantation regions 340 and the substrate 310, the ions may be limited and/or prevented from diffusing beyond the ion implantation regions 340 and the accuracy of selective growth of graphene may be increased.

FIGS. 6A to 6D are cross-sectional views for explaining a method of selectively growing graphene, according to another embodiment.

Figure 6A:
FIGS. 6A to 6D are cross-sectional views for explaining a method of selectively growing graphene, according to another embodiment.

Referring to FIG. 6A, a substrate 410 is provided in a reaction chamber (not shown). The substrate 410 may include a substrate for directly growing graphene. The substrate 410 may include the same substrate material as the substrate 10 in FIGS. 1A to 1C or the substrate 110 in FIGS. 2A to 2C.

Figure 6B:
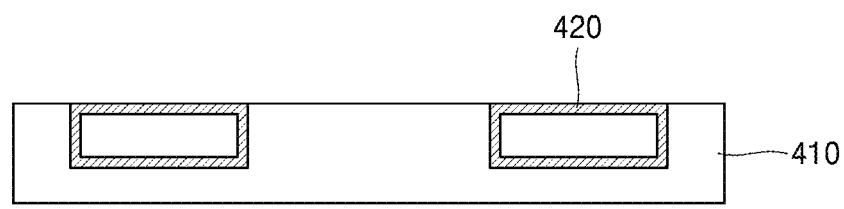

Referring to FIG. 6B, one or more first ion implantation regions 420 may be formed by implanting first ions locally into a surface of the substrate 410. The first ions may include ions that are configured to inhibit graphene growth, such as B ions, but example embodiments are not limited thereto. The first ion implantation region 420 may be formed using process conditions like those described above for forming the ion implantation region 220 in FIG. 4B.

Figure 6C:
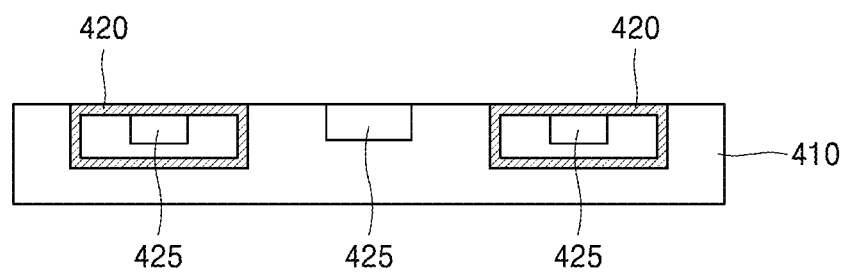

Referring FIG. 6C, one or more second ion implantation region 425 may be formed by locally implanting second ions locally into a surface of the substrate 410. The second ion implantation region 425 may be formed using process conditions like those described above for forming the ion implantation regions 20 and 120 in FIGS. 1B and 2B. The second ions may include ions (e.g., P, C) that are configured to promote graphene growth on the substrate.

As shown in FIG. 6C, the second ion implantation region 425 may be formed in the first ion implantation region 420 such that the first ion implantation region surrounds side and bottom surfaces of the second ion implantation region 425. The second implantation region 425 may also be formed in a portion of the substrate 410 that does not include first ion implantation region 420 to a provide a second implantation region 425 that is not surrounded on side and bottom surfaces by the first ion implantation 420.

Figure 6D:
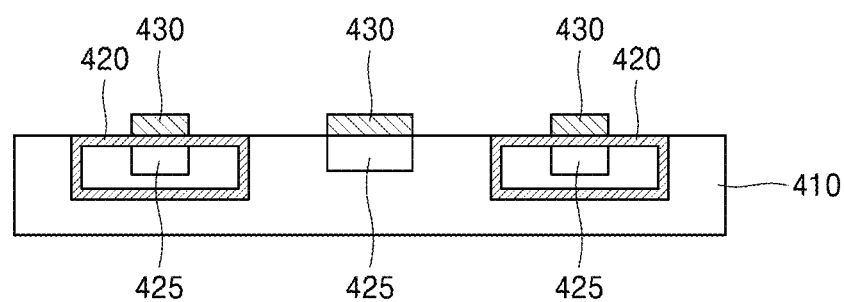

Referring to FIG. 6D, graphene 430 may be selectively grown on the second ion implantation region 425, but not the first ion implantation region 420 of the substrate 410. The graphene 430 may be grown using process conditions like those discussed above for growing the graphene 30 in FIG. 1C.

Figure 6E:
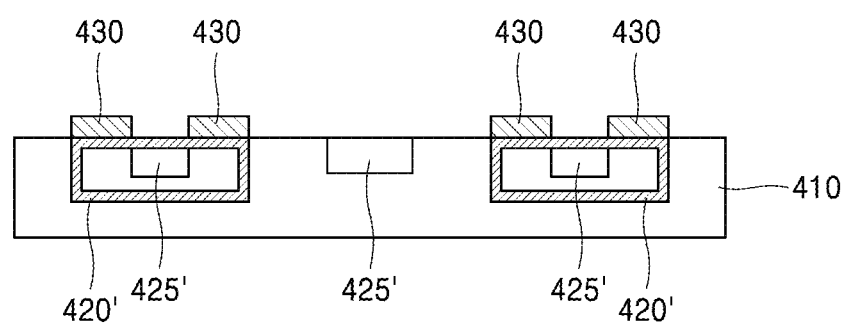
FIG. 6E is a cross-sectional view for explaining a method of selectively growing graphene, according to another embodiment.

FIG. 6E is a cross-sectional view for explaining a method of selectively growing graphene, according to another embodiment.

Referring to FIG. 6E, a variation of method in FIGS. 6A to 6D may be implemented by forming the first ion implantation region 420' with ions that promote the growth of graphene (e.g., P, C) and forming the second ion implantation region 425' with ions (e.g., B) that inhibit the growth of graphene. As a result, as shown in FIG. 6E, when graphene 430 is formed on the substrate 410, the graphene 430 may be selectively formed on the first ion implantation regions 420' and not the substrate 410 or second ion implantation regions 420'.

Figure 6F:
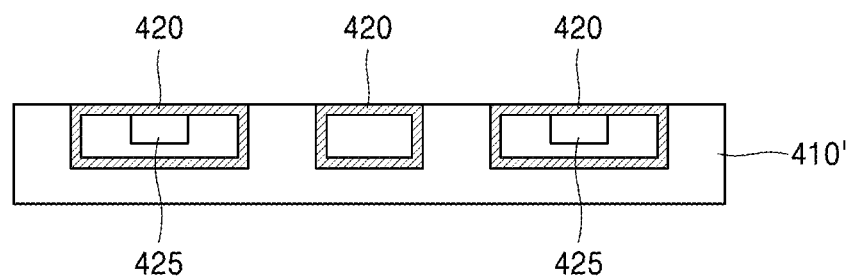
FIGS. 6F and 6G are cross-sectional views for explaining a method of selectively growing graphene according to another embodiment.
Figure 6G:
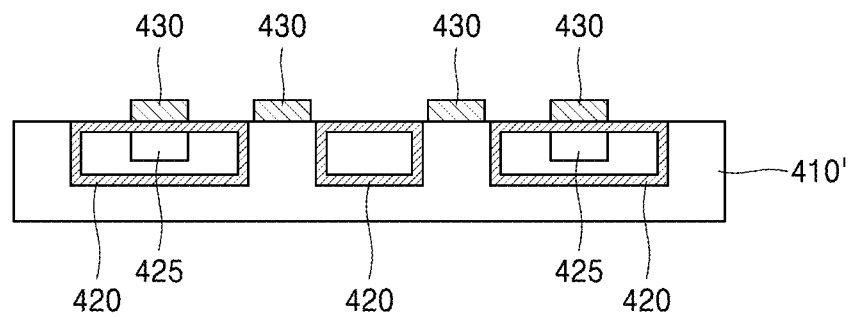

FIGS. 6F and 6G are cross-sectional views for explaining a method of selectively growing graphene according to another embodiment.

Referring FIG. 6F, a substrate 410' may be prepared like the substrate 210 in FIGS. 4A to 4C so the substrate 410' includes a dopant for promoting graphene growth in ion non-implantation regions. Dopants that promote graphene growth may include, for example, at least one of As, P, $BCl_2$, In, Sb, Ge, N, H, He, and C.

Referring to FIG. 6F, one or more first ion implantation regions 420 may be formed by implanting first ions locally into a surface of the substrate 410'. The first ions may include ions that are configured to inhibit graphene growth, such as B ions, but example embodiments are not limited thereto. The first ion implantation region 420 may be formed using process conditions like those described above for forming the ion implantation region 220 in FIG. 4B. One or more second ion implantation region 425 may be formed by locally implanting second ions locally into a surface of the substrate 410'. The second ion implantation region 425 may be formed using process conditions like those described above for forming the ion implantation regions 20 and 120 in FIGS. 1B and 2B. The second ions may include ions (e.g., P, C) that are configured to promote graphene growth on the substrate.

As shown in FIG. 6F, the second ion implantation region 425 may be formed in the first ion implantation region 420 such that the first ion implantation region surrounds side and bottom surfaces of the second ion implantation region 425. Also, as shown in FIG. 6F, the second ion implantation region 425 may not be formed in some of the first ion implantation regions 420.

Referring to FIG. 6G, graphene 430 may be selectively grown on the substrate 410' and second ion implantation region 425, but not the first ion implantation region 420 of the substrate 410'. The graphene 430 may be grown using process conditions like those discussed above for growing the graphene 30 in FIG. 1C and/or the graphene 230 in FIG. 4C.

The method of selectively growing graphene, according to an embodiment, may selectively grow graphene through an ion implantation method. According to an embodiment, graphene may be directly and selectively grown without a patterning process, and graphene may be grown in a selected region, and thus, the application of capping or encapsulation is possible. Also, contact resistance in a selected region may be improved by the selective growth of graphene. Since the technique of directly and selectively growing nanocrystalline graphene on a surface of a substrate at relatively low temperatures may be applied to complementary metal-oxide-semiconductor (CMOS) processes, the technique may also be readily applied to form an element of a semiconductor, such as a barrier metal or a source/drain contact, and to manufacture a pellicle of exposure equipment, or to DRAM, etc.

The method of selectively growing graphene, according to an embodiment, may readily and selectively grow graphene by using ion implantation. The method of selectively growing graphene, according to an embodiment, may selectively grow graphene by implanting ions that promote or inhibit graphene growth locally on a substrate for growing graphene.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:
1. A method of growing graphene selectively, the method comprising:
   forming an ion implantation region and an ion non-implantation region in a substrate by implanting ions locally into the substrate; and
   selectively growing graphene in the ion implantation region or the ion non-implantation region, wherein
   the selectively growing graphene in the ion implantation region or the ion non-implantation region includes forming a graphene pattern on the substrate,
   the graphene pattern includes graphene on one of the ion implantation region or the ion non-implantation region, and
   the graphene pattern exposes an other of the ion implantation region or the ion non-implantation region.
2. The method of claim 1, wherein the ions comprise at least one of As, P, B, $BCl_2$, In, Sb, Ge, N, H, He, and C.
3. The method of claim 1, wherein the ions are implanted in a range of $10^{11}$ at/cm$^2$ to $10^{17}$ at/cm$^2$.
4. The method of claim 1, wherein the forming the ion implantation region is performed with an energy in a range of about 0.1 keV to about 10,000 keV during the implanting ions locally into the substrate.
5. The method of claim 1, wherein the ions are configured to promote growth of graphene.
6. The method of claim 1, wherein the ions are configured to inhibit growth of graphene.
7. The method of claim 1, further comprising:
   doping a dopant into the substrate, wherein
   the dopant is configured to inhibit growth of graphene on the substrate.
8. The method of claim 1, further comprising:
   doping boron (B) into the substrate; and
   doping phosphorus (P) into the ion implantation region.
9. The method of claim 1, further comprising:
   forming a diffusion barrier between the ion implantation region and a portion of the substrate adjacent thereto.
10. The method of claim 9, wherein the diffusion barrier comprises TiN, TaN, graphene, or h-BN.
11. The method of claim 1, wherein the substrate comprises a semiconductor, a conductor, or an insulator.
12. The method of claim 1, wherein the
    substrate comprises at least one of silicon, polysilicon, silicon oxide, titanium nitride, a derivative of silicon, a derivative of polysilicon, a derivative of silicon oxide, a derivative of titanium nitride, or a metal.
13. The method of claim 1, wherein the selectively growing graphene is performed using a plasma chemical vapor deposition process.

14. The method of claim 1, wherein the selectively growing graphene is performed at a temperature of 700 degrees or less.

15. The method of claim 1, wherein the selectively growing graphene is performed at a process pressure in a range of about 0.01 Torr to about 5 Torr.

16. The method of claim 1, wherein the selectively growing graphene is performed using a reaction gas including a mixture of a carbon source gas, an inert gas, and hydrogen gas.

17. The method of claim 16, wherein the carbon source gas comprises at least one of methane gas, ethylene gas, acetylene gas, and a vapor of a liquid precursor including carbon.

18. The method of claim 16, wherein the inert gas comprises at least one of argon gas, nitrogen gas, helium gas, krypton gas, and xenon gas.

19. A method of selectively growing graphene, the method comprising:

forming a first region in a substrate structure by transferring ions into the first region of the substrate structure and not transferring the ions into a second region of the substrate structure adjacent thereto along a surface of the substrate structure; and selectively growing graphene on the surface of the substrate structure in the first region or the second region, wherein the selectively growing graphene on the surface of the substrate structure in the first region or the second region including forming a graphene pattern on the surface of the substrate structure, the graphene pattern includes graphene on one of the first region or the second region, and the graphene pattern exposes an other of the first region or the second region.

20. The method of claim 19, wherein the ions comprise at least one of As, P, B, $BCl_2$, In, Sb, Ge, N, H, He, and C.

21. The method of claim 19, wherein the selectively growing graphene on the surface of the substrate structure is performed to selectively grow the graphene on the first region of the substrate structure.

22. The method of claim 19, wherein the selectively growing graphene on the surface of the substrate structure is performed to selectively grow the graphene on the second region of the substrate structure.

23. The method of claim 19, wherein the substrate structure includes a diffusion barrier between the first region of the substrate structure and a portion of the substrate structure adjacent thereto.

* * * * *